United States Patent
Voronin et al.

(10) Patent No.: US 9,512,518 B2
(45) Date of Patent: Dec. 6, 2016

(54) APPARATUS FOR TREATING A GAS STREAM

(75) Inventors: Sergey Alexandrovich Voronin, Rensselaer, NY (US); Christopher James Philip Clements, Burnham on Sea (GB); John Leslie Bidder, Bristol (GB); Joanne Walsh, legal representative, Kingswood (GB)

(73) Assignee: Edwards Limited, Burgess Hill, West Sussex (GB)

( * ) Notice: Subject to any disclaimer, the term of this patent is extended or adjusted under 35 U.S.C. 154(b) by 199 days.

(21) Appl. No.: 14/239,017

(22) PCT Filed: Jul. 11, 2012

(86) PCT No.: PCT/GB2012/051630
§ 371 (c)(1),
(2), (4) Date: Jul. 25, 2014

(87) PCT Pub. No.: WO2013/024247
PCT Pub. Date: Feb. 21, 2013

(65) Prior Publication Data
US 2015/0027373 A1    Jan. 29, 2015

(30) Foreign Application Priority Data

Aug. 17, 2011   (GB) .................................. 1114172.8

(51) Int. Cl.
*C23C 16/455* (2006.01)
*B01D 53/32* (2006.01)
(Continued)

(52) U.S. Cl.
CPC ......... *C23C 16/45508* (2013.01); *B01D 53/32* (2013.01); *B03C 3/78* (2013.01);
(Continued)

(58) Field of Classification Search
CPC .................... C23C 16/45508; C23C 16/4404; C23C 16/45563; C23C 16/513; B01D 53/32; B01D 2252/103; B01D 2257/106; B01D 2257/2027; B01D 2257/2047; B01D 2257/402; B01D 2257/406; B01D 2257/553; B01D 2258/0216; B03C 3/78; B03C 3/82; H05H 1/341

See application file for complete search history.

(56) References Cited

U.S. PATENT DOCUMENTS 3,149,222 A * 9/1964 Giannini et al. ......... 219/121.44
5,053,093 A * 10/1991 Ciccarelli et al. ......... 156/89.25
(Continued)

FOREIGN PATENT DOCUMENTS

EP     0712666 A1    5/1996
EP     1297891 A1    4/2003
(Continued)

OTHER PUBLICATIONS

First Office Action dated Mar. 20, 2015 for corresponding Chinese Application No. 201280040090.6.
(Continued)

*Primary Examiner* — Xiuyu Tai
(74) *Attorney, Agent, or Firm* — Westman, Champlin & Koehler, P.A.; Theodore M. Magee

(57) ABSTRACT

An apparatus for treating a gas stream. A plasma generator generates a plasma flare. A first inlet conveys the gas stream into the apparatus. A reaction chamber is located downstream of the plasma generator in which gas is treated. A second inlet receives a liquid into the apparatus for establishing a liquid weir over an interior surface of the reaction chamber for resisting accumulation of solid deposits on the interior surface. A weir guide has an outer annular surface for directing liquid over the interior surface and an inner (Continued)

annular surface in flow communication with the outer surface so that liquid flows form the outer surface to the inner surface to resist depositing on the inner surface.

11 Claims, 2 Drawing Sheets

(51) Int. Cl.
    *B03C 3/78*     (2006.01)
    *B03C 3/82*     (2006.01)
    *H05H 1/34*     (2006.01)
    *C23C 16/44*     (2006.01)
    *C23C 16/513*     (2006.01)

(52) U.S. Cl.
    CPC ............ *B03C 3/82* (2013.01); *C23C 16/4404* (2013.01); *C23C 16/45563* (2013.01); *C23C 16/513* (2013.01); *H05H 1/341* (2013.01); *B01D 2252/103* (2013.01); *B01D 2257/106* (2013.01); *B01D 2257/2027* (2013.01); *B01D 2257/2047* (2013.01); *B01D 2257/402* (2013.01); *B01D 2257/406* (2013.01); *B01D 2257/553* (2013.01); *B01D 2258/0216* (2013.01); *B01D 2259/818* (2013.01); *Y02C 20/10* (2013.01)

(56) References Cited

U.S. PATENT DOCUMENTS

| | | |
|---|---|---|
| 5,833,888 A | 11/1998 | Arya et al. |
| 2007/0172398 A1 | 7/2007 | Clark et al. |
| 2011/0088556 A1 | 4/2011 | Langle et al. |

FOREIGN PATENT DOCUMENTS

| | | | |
|---|---|---|---|
| JP | 2004209373 A | | 7/2004 |
| TW | 200900135 A | | 1/2009 |
| WO | 2006135272 A1 | | 12/2006 |
| WO | 2007060385 A1 | | 5/2007 |
| WO | 2008093442 A1 | | 8/2008 |
| WO | 2009066395 A1 | | 5/2009 |

OTHER PUBLICATIONS

PCT International Search Report dated Nov. 30, 2012 for corresponding Application No. PCT/GB2012/051630, filed Jul. 11, 2012.
PCT International Written Opinion dated Nov. 30, 2012 for corresponding Application No. PCT/GB2012/051630, filed Jul. 11, 2012.
British Search Report dated Nov. 28, 2011 for corresponding Application No. GB1114172.8.
Office Action dated Mar. 10, 2016 and Search Report dated Mar. 1, 2016 for corresponding Taiwnese Application No. 101125893.
Office Action dated Jun. 23, 2016 for corresponding Japanese Application No. JP2014-525482.

\* cited by examiner

APPARATUS FOR TREATING A GAS STREAM

CROSS-REFERENCE TO RELATED APPLICATION

This Application is a Section 371 National Stage Application of International Application No. PCT/GB2012/051630, filed Jul. 11, 2012, which is incorporated by reference in its entirety and published as WO 2013/024247 A1 on Feb. 21, 2013 and which claims priority of British Application No. 1114172.8, filed Aug. 17, 2011.

BACKGROUND

The present invention relates to apparatus for treating a gas stream. The invention finds particular application in the treatment of a gas stream exhaust from a process chamber used in the semiconductor or flat panel display industry.

A primary step in the fabrication of semiconductor devices is the formation of a thin film on a semiconductor substrate by chemical reaction of vapour precursors. One known technique for depositing a thin film on a substrate is chemical vapour deposition (CVD), which is commonly plasma enhanced. In this technique, process gases are supplied to a process chamber housing the substrate and react to form a thin film over the surface of the substrate. Examples of gases supplied to the process chamber to form a thin film include, but are not restricted to: Silane and ammonia for the formation of a silicon nitride film; Silane, ammonia and nitrous oxide for the formation of a SiON film; TEOS and one of oxygen and ozone for the formation of a silicon oxide film; and $Al(CH_3)_3$ and water vapour for the formation of an aluminium oxide film.

Gases exhausted from a process chamber can be treated with high efficiency and at a relatively low cost using a plasma abatement device. In the plasma abatement process, the gas stream is caused to flow into a high density plasma and under the intensive conditions within the plasma species within the gas stream are subjected to impact with energetic electrons causing dissociation into reactive species which can combine with oxygen or hydrogen to produce relatively stable by-products.

During the plasma abatement of gases that produce solid by-products (for example, silica during silane or TEOS oxidation), blockage problems have been encountered in the reaction chamber located down stream of the plasma flare. The chamber typically consists of a pipe of approximately 30 mm in diameter and 90-150 mm in length. The purpose of the reaction chambers is to contain the hot gases in a restricted volume to allow abatement reactions to occur. However, the chamber may become blocked with for example silica particles adhering to the interior surface when abating for example silane, TEOS or organosilanes.

One way of avoiding the adhesion of particles to the walls of the chamber is to form a water weir over their surface. However, there are nevertheless "dry" areas of the plasma reactor between the electrode (anode) and the reaction chamber, and the electrode itself requires additional cleaning.

The discussion above is merely provided for general background information and is not intended to be used as an aid in determining the scope of the claimed subject matter. The claimed subject matter is not limited to implementations that solve any or all disadvantages noted in the background.

SUMMARY

The present invention provides apparatus for treating a gas stream, comprising a plasma generator for generating a plasma flare, a first inlet for conveying the gas stream into the apparatus, and a reaction chamber downstream of the plasma generator in which the gas stream is treated by the generated plasma flare, a second inlet for receiving a liquid into the apparatus for establishing a liquid weir over an interior surface of the reaction chamber for resisting the accumulation of solid deposits from plasma treatment on the interior surface, and a flow director, i.e. a weir guide, having an outer annular surface in flow communication with the second inlet and located relative to the interior surface of the reaction chamber for directing the liquid over the interior surface of the reaction chamber, wherein the flow director further comprises an inner annular surface in flow communication with the outer annular surface of the flow director so that liquid can flow over the interior annular surface of the flow director to resist depositing on the inner annular surface of the flow director.

In a second aspect, the present invention provides a flow director, i.e. a weir guide, having an outer annular surface that, in use, will be arranged in flow communication with a liquid inlet and located relative to the interior surface of a reaction chamber for directing the liquid over the interior surface of the reaction chamber, wherein the flow director further comprises an inner annular surface in flow communication with the outer annular surface so that said liquid can flow over the interior annular surface to resist depositing on the inner annular surface of the flow director.

The Summary is provided to introduce a selection of concepts in a simplified form that are further described in the Detail Description. This Summary is not intended to identify key features or essential features of the claimed subject matter, nor is it intended to be used as an aid in determining the scope of the claimed subject matter.

BRIEF DESCRIPTION OF THE DRAWINGS

In order that the present invention may be well understood, some embodiments thereof, which are given by way of example only, will now be described with reference to the accompanying drawings, in which.

DETAILED DESCRIPTION

Figure 1:
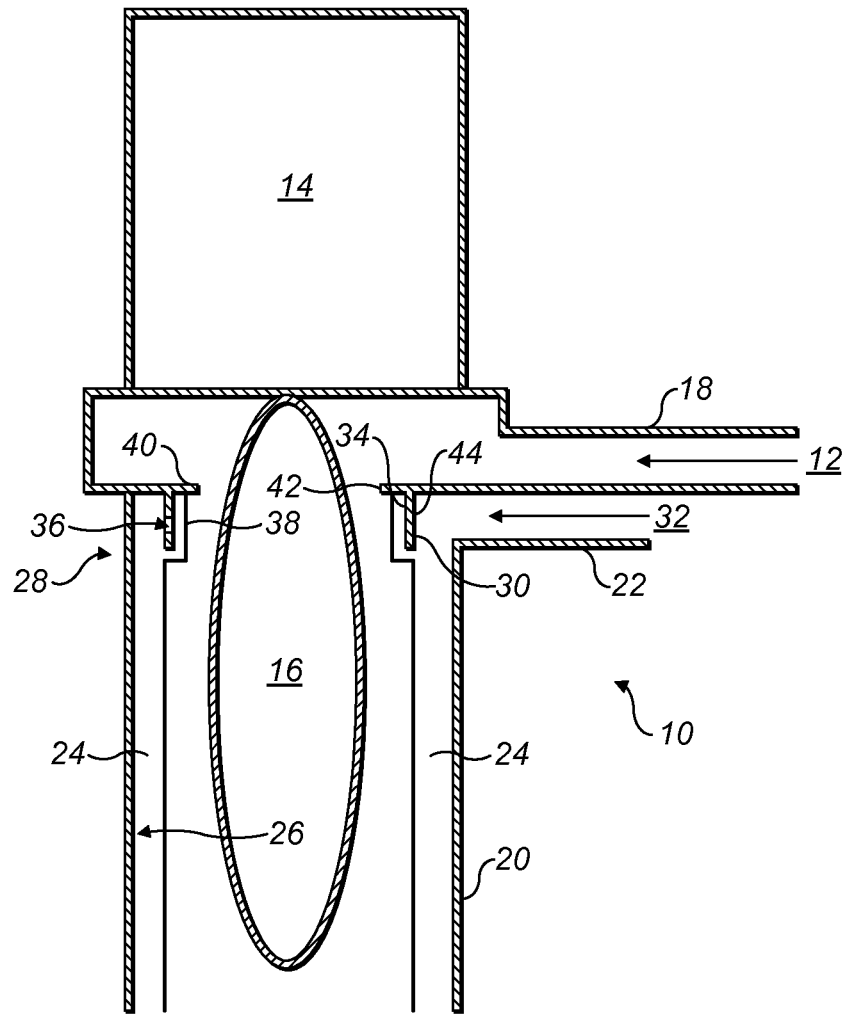
FIG. 1 is a schematic representation of apparatus for treating a gas stream.

Referring to FIG. 1, apparatus 10 is shown for treating a gas stream 12. The apparatus comprises a plasma generator 14 for generating a plasma flare 16. A first inlet 18 conveys the gas stream 12 into the apparatus. A reaction chamber 20 is located downstream of the plasma generator in which the gas stream is treated by the generated plasma flare. Some gas may be treated outside of the reaction chamber.

A second inlet 22 receives a liquid 32, typically water, into the apparatus for establishing a liquid weir 24 over an interior surface 26 of the reaction chamber 22 for resisting the accumulation of solid deposits from plasma treatment on the interior surface 26. The reaction chamber is generally cylindrical in this example.

Figure 2:
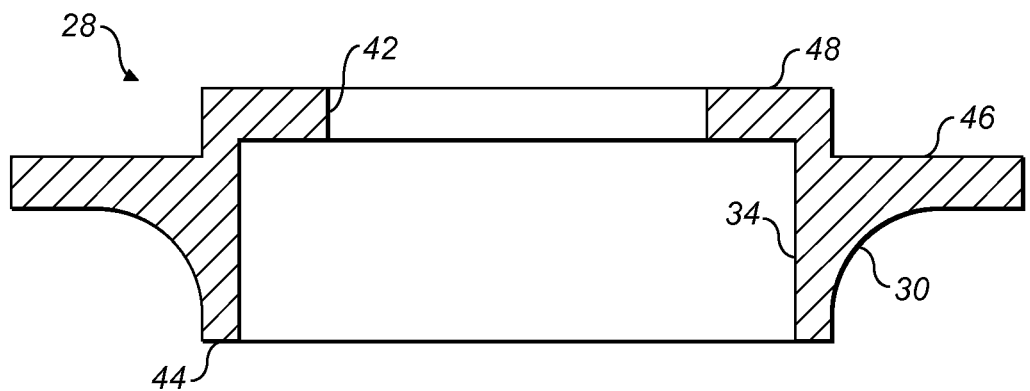
FIG. 2 shows a flow director of the apparatus.
Figure 3:
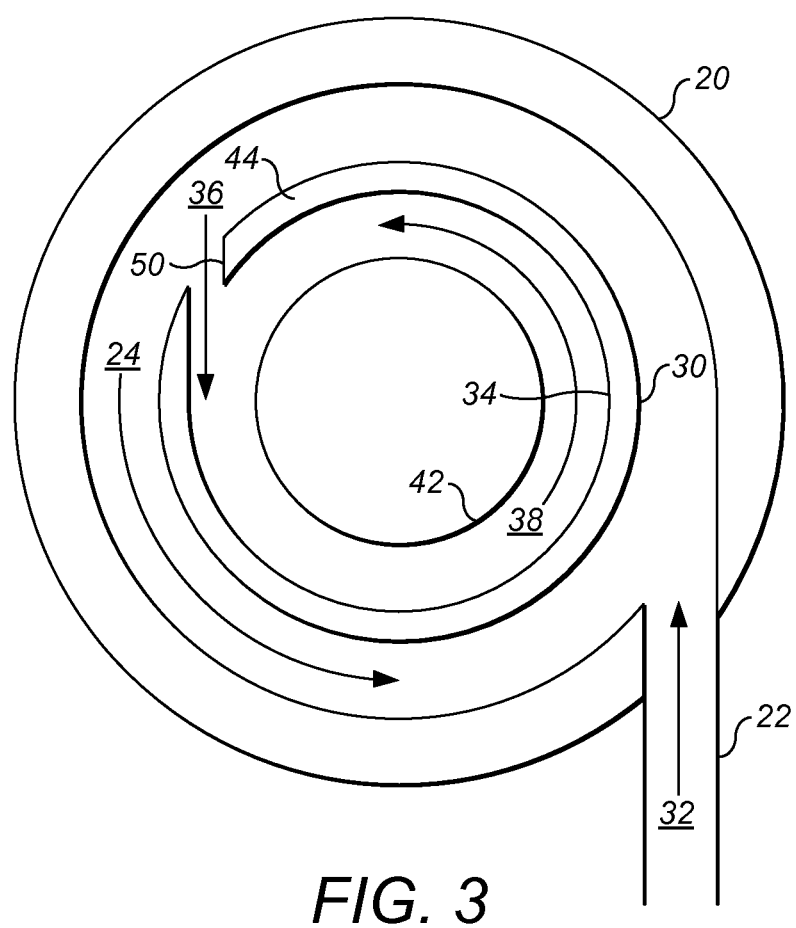
FIG. 3 shows the flow director in use.

A flow director is shown generally at 28 and is shown in more detail in FIGS. 2 and 3. The flow director may be integral with the reaction chamber or may consist of an insert adapted to be fitted in a treatment apparatus. The flow director has an outer annular surface 30 in flow communication with the second inlet 22 and located relative to the interior surface 26 of the reaction chamber for directing water over the interior surface for establishing water weir 24. The flow director also has an inner annular surface 34 in flow communication with the outer annular surface 30 as shown by the small arrow 36 in FIG. 1 so that liquid is directed to flow and over the inner annular surface 34 to resist depositing on the inner annular surface. The liquid flowing over the inner annular surfaces establishes a small water weir 38 which initially flows over the inner annular surface and then drops under gravity to be incorporated in the larger water weir 24. Accordingly, a water weir is established on both the inner and the outer surfaces of the flow director. Flow communication between the inner and outer annular surfaces is shown in more detail in FIG. 3.

The flow director 28 has a barrier surface 40 located between the inner and outer annular surfaces 34, 30 on the one hand and the plasma generator 14 on the other hand for resisting wetting of the plasma generator by the water weirs 24, 38 flowing over the inner and outer annular surfaces. The barrier surface in this example is a flange extending generally radially inwardly to provide a physical barrier between the water weirs 24, 38 and the plasma generator. The barrier surface prevents damage occurring to the plasma generator. The barrier surface defines an aperture 42 through which the plasma flare 16 can extend into the reaction chamber. The aperture should be sufficiently large that the plasma flare does not ordinarily contact it, otherwise it could become degraded by the hot plasma.

The inner and outer annular surfaces are formed by a generally annular wall 44 depending from the barrier surface 40 in a downstream direction. As shown in FIG. 1, the annular wall extends generally orthogonally to the barrier surface approximately 10-20 mm depending on the overall dimensions of the apparatus. FIGS. 2 and 3 show the flow director 28 in more detail. The inner annular surface 34 is generally cylindrical whilst the outer annular surface 30 in this example has a curved face for directing the liquid from the liquid inlet 22 over the interior walls of the reaction chamber. The barrier surface is made up of first and second surfaces 46, 48 formed by two flanges extending perpendicularly from the upstream edge of the annular wall 44. Barrier surface 46 resists the passage of water upstream from the main weir 24 whereas barrier surface 48 resists the passage of water upstream from the smaller weir 38. The surfaces 46, 48 are not aligned as is the case in the arrangement shown in FIG. 1.

FIG. 3 shows the flow director 28 in use and is a sectional view looking upstream at the flow director. Water 32 is conveyed into the apparatus through inlet 22 at an angle which is generally tangential to the annular shape of the flow director. The outer annular surface 30 directs the water through its full circumference in order to establish a water weir 24 over the 360° extent of the reaction chamber. The outer annular surface 30 together with the interior surface of the reaction chamber 26 forms an annular channel along which the water is conveyed. The curved outer annular surface also directs the water gradually in a downward direction. A break 50 in the annular wall 44 allows flow communication 36 between the inner and outer annular surfaces 30, 34 of the flow director. The break may be any type of interruption in the circumference of the annular wall, for example a through bore or channel, however the break should be configured so that some but not all of the water circulating over the outer annular surface is directed over the inner annular surface. In this way, the outer annular surface is not starved of water required to establish the main water weir over the full circumferential extent of the reaction chamber. Conversely, sufficient water must be conveyed to the inner annular surface to establish a water weir over the full annular extent of the inner surface. A through bore which has a conductance of preferably less than half of the inlet 22 may be preferred.

The size of this channel is selected to optimise the flow of water around the central orifice. If the channel is too large then a high flow of water enters the central orifice and creates a spray which causes detrimental cooling of the plasma flare. If the channel is too small the water entering the central orifice is insufficient to completely wash the inside walls of the orifice and prevent solid adhesion/build up.

In the example shown in FIG. 3, the through bore is tangentially aligned to convey water onto the inner annular surface 34 in a generally tangential direction to establish the smaller water weir 38 over the full circumferential extent of the inner annular surface. It also preferred that the through bore is located in a position which is generally diametrically opposed from the inlet 22 or at least not immediately downstream of the inlet 22 so that water being conveyed into the apparatus at pressure is not forced straight from the inlet 22 to the through bore 50.

The outer annular surface has a diameter which is less than the diameter of the reaction chamber and in close proximity thereto so that liquid directed around the outer annular surface is transferred generally tangentially onto the interior surface of the reaction chamber so that the liquid weir is established over substantially all of the interior surface. At a water inlet pressure of 1 to 1.5 bar a 2 mm spacing between the outer annular surface and the interior wall of the reaction chamber has been found to produce good results.

As indicated above the flow director may be an insert located at the mouth of the reaction chamber. In order to ensure thermal robustness and prevent corrosion the flow director, also known as a weir guide, may be manufactured from sintered silicon carbide. This material, as well as other ceramics, has a high thermal stability and is therefore suitable to be located proximate the plasma flare, where the temperature can reach 1500° C. Silicon carbide is also chemically resistant to attack from halogen-containing chemicals (especially, fluorine and HF) which are widely used in the semiconductor industry.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An apparatus for treating a gas stream, comprising a plasma generator for generating a plasma flare, a first inlet for conveying the gas stream into the apparatus, and a reaction chamber downstream of the plasma generator in which the gas stream is treated by the generated plasma flare, a second inlet for receiving a liquid into the apparatus for establishing a liquid weir over an interior surface of the reaction chamber for resisting the accumulation of solid deposits from plasma treatment on the interior surface, and a flow director having a wall with an outer annular surface, an inner annular surface and an opening in the wall from the outer annular surface to the inner annular surface, the outer annular surface in flow communication with the second inlet and located relative to the interior surface for directing the liquid over the interior surface and the inner annular surface in flow communication with the outer annular surface through the opening in the wall so that liquid can flow over the inner annular surface to resist depositing on the inner annular surface.

2. The apparatus as claimed in claim 1, wherein the second inlet is angled relative to the flow director so that liquid is conveyed from the second inlet generally tangentially over the outer annular surface.

3. The apparatus as claimed in claim 1, the flow director having a barrier surface located between the inner and outer annular surfaces and the plasma generator for resisting wetting of the plasma generator by liquid being directed by the inner and outer annular surfaces.

4. The apparatus as claimed in claim 3, wherein the barrier surface defines an aperture through which the plasma flare can extend into the reaction chamber.

5. The apparatus as claimed in claim 3, wherein the wall comprises a generally annular wall depending from the barrier surface in a downstream direction.

6. The apparatus as claimed in claim 4, wherein the opening in the wall is shaped to direct liquid from the outer annular surface in a generally tangential direction relative to the inner annular surface.

7. The apparatus as claimed in claim 6, wherein the opening is formed by a tangentially aligned bore through the wall.

8. The apparatus as claimed in claim 6, wherein the outer annular surface has a diameter which is less than the diameter of the reaction chamber and in close proximity thereto so that liquid directed around the outer annular surface is transferred generally tangentially onto the interior surface of the reaction chamber so that the liquid weir is established over substantially all of the interior surface.

9. The apparatus as claimed in claim 1, wherein the flow director is made of silicon carbide.

10. A flow director in or for an apparatus for treating a gas stream, the apparatus comprising a plasma generator for generating a plasma flare, a first inlet for conveying the gas stream into the apparatus, and a reaction chamber downstream of the plasma generator in which the gas stream is treated by the generated plasma flare, a second inlet for receiving a liquid into the apparatus for establishing a liquid weir over an interior surface of the reaction chamber for resisting the accumulation of solid deposits from plasma treatment on the interior surface, the flow director having an a wall with an outer annular surface, an inner annular surface and an opening through the wall from the outer annular surface to the inner annular surface, the outer annular surface in flow communication with the second inlet and located relative to the interior surface for directing the liquid over the interior surface and the inner annular surface in flow communication with the outer annular surface through the opening so that liquid can flow over the inner annular surface to resist depositing on the inner annular surface.

11. A flow director having an outer annular surface arranged in flow communication with a liquid inlet and located relative to an interior surface of a reaction chamber for directing a liquid from the liquid inlet over the interior surface of the reaction chamber, wherein the flow director further comprises an inner annular surface in flow communication with the outer annular surface through an opening in a wall so that said liquid can flow over the inner annular surface to resist depositing on the inner annular surface of the flow director, wherein the outer annular surface is between the liquid inlet and the inner annular surface.

\* \* \* \* \*